United States Patent Office 3,041,198

Patented June 26, 1962

3,041,198

ELECTROLESS PLATING PROCESS

Anthony J. Certa, Norristown, and Charles H. Pool, Telford, Pa., assignors, by mesne assignments, to Philco Corporation, Philadelphia, Pa., a corporation of Delaware No Drawing. Filed Oct. 14, 1960, Ser. No. 62,550
26 Claims. (Cl. 117—50)

This invention relates to a process for conditioning a substrate comprising tin or lead or both metals so that these metals thereafter are readily platable with another metal upon application thereto of an electroless metal-plating solution of the type containing ions of said other metal and hypophosphate ions. Heretofore no process has been known for electrolessly plating metal on tin, lead, their mixtures or their alloys.

The following is a flow diagram of the process:

A substrate comprising lead, tin or both metals is cleansed.

↓

The substrate is contacted with a solution comprising nickel, cobalt or iron ions and an agent consisting of acetate or chloride ions or both, the concentration of the agent being such that the lead and tin in the substrate when contacted by the solution exhibit a higher electrochemical potential than the ions of nickel, cobalt or iron in the solution.

↓

The substrate is rinsed and then contacted with a metal ion, hypophosphite plating bath, thereby to plate metal from said bath, electrolessly onto said substrate.

While not limited thereto the invention is particularly useful in the fabrication of ultra-high-frequency diodes. One form of ultra-high frequency diode comprises a housing which includes a cylindrical glass tube having two hollow cylindrical Kovar pins fused coaxially thereto at its opposite ends. (Kovar is a trademark for a series of cobalt-nickel-iron alloys of the type described in expired United States Patent No. 2,062,335 to H. Scott. One such alloy is composed of 54 percent by weight of iron, 29 percent by weight of nickel, 17 percent by weight of cobalt and traces of manganese and carbon.) The diode also comprises a semiconductive wafer soldered to an end of a cylindrical stud and a pointed whisker wire welded to a side of another cylindrical stud. Each stud is force-fitted through one of the hollow pins in a manner such that, within the glass cylinder, the point of the whisker wire bears upon the surface of the semiconductive wafer. The pins are the terminals of the diode.

To isolate the interior of the glass cylinder from the atmosphere, thereby to protect the semiconductive wafer from contamination by noxious atmospheric substances, the hollow portion of each pin is filled with a solder plug typically composed of 60 percent by weight of lead and 40 percent by weight of tin. This plug is made by flowing molten solder into the hollow portion of the pin until it is filled. To make the interior surfaces of the Kovar pins more easily wettable by the molden solder and prevent corrosion of the surfaces of the pins during subsequent processing, the pin surfaces preferably are plated with a base layer of electroless nickel and an exterior layer of electroless gold prior to filling them with the solder. This nickel plating may be applied by using a conventional electroless nickel plating process. The gold plating may be applied by using the process described and claimed in the co-pending application of A. J. Certa, Serial No. 811,512, filed May 7, 1959, entitled "Bath and Method for Plating Gold."

To provide a surface on the pins having a very high electrical conductivity (thereby to improve the operation of the diode at ultra-high-frequencies by reducing skin-effect losses) and to enhance the appearance of the diode, it is desirable to apply an additional layer of gold to the surfaces of the pins and a layer of gold to the surfaces of the solder plugs. However heretofore it has been believed that gold cannot be deposited directly on either lead or tin by an electroless process and that to permit such gold deposition on a lead-tin surface it is necessary to cover it with a substantial layer of a metal platable by the electroless gold-plating solution, e.g. nickel or copper. Customarily this layer has been applied by plating copper electrolytically onto the surfaces of the pins and plugs. However such electroplating is both time-consuming and expensive. In particular, to electroplate these pins and plugs, it is necessary to make an electrical connection to each of them. This is a tedious and time-consuming operation because the diodes are small and relatively hard to grasp and because they are fragile and must be handled gently. Moreover it is an expensive operation because electrical connections can conveniently be made to only a small number of diodes at a time. Obviously much time and money could be saved if it were possible to apply a coating of nickel electrolessly over both the lead-tin solder and the pins, since no electrical connections to the diode pins would then be required and many more diodes could be plated conveniently at one time. In addition the nickel would provide enhanced protection against corrosion for the easily corroded Kovar pins. Moreover it also would be useful to be able to plate electroless gold directly onto the pins and plugs in those instances in which the corrosion protection afforded by an additional coating of nickel is not needed. However heretofore no process was known by which either nickel or gold could be plated electrolessly onto either lead or tin or both metals.

Accordingly an object of the invention is to provide a process for plating a metal electrolessly on a substrate which comprises tin or lead or both metals.

Another object is to provide a process for conditioning a substrate comprising either lead or tin or both metals so that thereafter it may be metal plated by applying thereto a conventional electroless metal-plating solution.

Another object is to provide a process for conditioning a substrate consisting essentially of tin or lead or both metals so that thereafter it may be plated with nickel, cobalt or gold by applying thereto a conventional electroless plating solution containing ions of the metal to be plated.

Another object is to provide a process which is particularly well adapted to condition the lead-tin solder plugs of diodes to be platable with nickel or gold by application thereto of a conventional electroless nickel or gold plating bath.

The foregoing objects are achieved in accordance with the invention by a process in which a substrate comprising tin or lead or both metals is contacted by a solution containing ions of one of the elements nickel, cobalt and iron and an agent which selectively complexes tin and lead ions. Such an agent may be one which complexes the tin or lead ions much more strongly than it complexes the nickel, cobalt or iron ions in the solution. Alternatively the agent may be one which complexes the lead or tin ions but does not appreciably complex the nickel, cobalt or iron ions. After the substrate has been contacted by this solution, it may then be plated with a metal by applying thereto a conventional electroless metal plating bath—for example a bath of the type containing hypophosphite anions and nickel or cobalt cations or aurocyanide anions. The precise action by which our solution conditions lead, tin or both to be platable by application thereto of a conventional electroless metal plating bath is not entirely clear. However it is believed that a small portion of the lead and tin present in the substrate dissolves into the conditioning solution to form lead and tin ions which then combine with the complexing agent to form complex lead-containing and tin-containing ions. Those of the latter ions present at the surface of the substrate condition the lead and tin metal therein to exhibit an electrochemical potential which is higher (less noble) than that of the nickel, cobalt or iron ions in the bath. These conditions enable an extremely thin layer of nickel, cobalt or iron to deposit onto the lead and tin components of the substrate by displacement of the lead and tin by the nickel, cobalt or iron ions present in the bath. Accordingly when a conventional electroless metal plating bath is applied to the so-treated substrate, the latter bath "sees" a catalytic nickel, cobalt or iron surface rather than a non-catalytic lead or tin surface and readily deposits on the substrate.

Other advantages and features of the invention will become apparent from the following discussion directed to specific examples of our process for conditioning a substrate containing lead or tin or both metals to be platable with metal by application thereto of a conventional electroless metal-plating bath. In the following specific examples, it is assumed that the substrate processed comprises the lead-tin solder plugs contained in the terminal pins of the aforedescribed diode. However it is to be understood that the process of the invention may be applied successfully to many other substrates comprising or consisting of lead or tin or both.

Prior to processing in accordance with the invention the lead-tin solder plugs of the diodes, the surfaces of these plugs and their pins are cleansed. This cleansing may be performed as follows: The diodes are immersed for about 30 minutes in methyl alcohol to degrease the pins and plugs. Next the diodes are rinsed in cold running tap water and then in warm water. The diodes then are immersed for about ten minutes in a five normal aqueous solution of potassium hydroxide maintained at about 80° C. Next they are rinsed thoroughly with warm tap water and immersed for about five minutes in a solution consisting essentially of about 5 parts by volume of concentrated hydrofluoric acid (48 to 52 percent HF by weight) and about 95 parts by volume of water. Then they are rinsed with cold water and immersed for about one minute in a solution composed of about one part by volume of concentrated sulfuric acid and about one part by volume of water. Finally the diodes are rinsed well in warm deionized water.

In accordance with the invention the diodes then are immersed in a solution containing nickel ions and an agent which selectively complexes lead and tin. Examples of several such solutions are now set forth:

*Example 1*

Nickel acetate $(CH_3COO)_2Ni \cdot 4H_2O$—20 grams.
Glacial acetic acid $CH_3COOH$ a quantity sufficient to reduce pH of solution to 3.0.
Deionized water to make one liter.

The nickel acetate is dissolved in about 500 milliliters of water and the resultant solution is diluted to about one liter. Then the acetic acid is stirred thereinto until the pH of the solution has fallen to about 3.0. The solution is heated to a temperature between about 90° C. and about 95° C. While the solution is maintained at this temperature, the diodes are immersed therein for about 10 minutes. Thereafter the diodes are removed therefrom and are rinsed in warm deionized water.

It is believed that during the immersion of the diodes in the foregoing solution, a small amount of lead and tin from the lead-tin solder plugs dissolves in ionic form in the layer of solution adjoining each plug. The lead and tin ions thus formed are complexed by acetate ions in the solution. The complex lead-acetate and tin-acetate ions raise the effective electrochemical potential of the lead and tin metal surfaces from a value substantially lower (more noble) than that of nickel to a value higher (less noble) than that of nickel. As a result the nickel ions in the conditioning solution are enabled to plate nickel metal on the surface of each solder plug by displacement therefrom of an extremely thin layer of tin and lead.

After the lead-tin plugs have been conditioned by immersion in the foregoing solution, they may be plated with electroless nickel by employing any conventional electroless nickel plating process. For example the following electroless nickel plating process has been found suitable for plating electroless nickel thereon. Prior to practicing this process, three stock solutions, hereinafter designated as solutions A, B and C respectively, are prepared. Solution A is prepared as follows: About 25.4 milliliters of glacial acetic acid and about 800 grams of nickel chloride $(NiCl_2 \cdot 6H_2O)$ are dissolved in about 1500 milliliters of deionized water. Thereafter the resultant solution is diluted to about two liters with deionized water. Solution B is prepared by dissolving about 600 grams of sodium acetate $(CH_3COONa \cdot 3H_2O)$ in sufficient deionized water to make about two liters of solution. The solution should be filtered to remove foreign substances. Solution C is prepared by dissolving about 960 grams of sodium hypophosphite $(NaH_2PO_2 \cdot H_2O)$ in sufficient deionized water to make about two liters of solution. To facilitate the dissolution of the sodium hypophosphite the solution may be heated to about 50° C.

These stock solutions are then used to make up the electroless nickel plating solution. To do this, about 100 milliliters of solution A, about 100 milliliters of solution B and about 100 grams of ammonium chloride are added to about 2700 milliliters of deionized water. The mixture is stirred until the ammonium chloride is completely dissolved. Then the resultant solution is heated to about 98° C. and thereafter maintained at a temperature between about 90° C. and about 97° C. throughout the plating process. Immediately before the diodes are immersed therein, about 100 milliliters of solution C are stirred into the hot solution. Then the diodes, whose lead-tin solder plugs have been processed according to the invention, are immersed for about 15 minutes in the resultant electroless nickel plating bath. During this immersion a bright, tenacious, uniform layer of electroless nickel plates readily onto the surfaces of the lead-tin plugs as well as onto the surfaces of the pins. After this plating is completed the diodes are removed from the plating bath and are rinsed well in warm deionized water. Then the surfaces of the plugs and pins may be electrolessly gold plated, for example by employing the electroless gold-plating process described and claimed in the copending application of A. Certa, Serial No. 811,512, filed May 7, 1959.

Electroless nickel is by no means the only metal which can be plated electrolessly onto a lead-tin subtrate processed according to the invention, nor need the subtrate comprise both lead and tin. On the contrary cobalt and gold can each be plated electrolessly on strips of pure lead or pure tin as well as on lead-tin solder plugs after these strips or plugs have been processed in the manner set forth above. To plate gold directly onto such subtrates, the electroless gold-plating process described and claimed in the above-identified Certa application may be employed. To plate cobalt directly onto such substrates, the following conventional electroless cobalt plating bath may be employed:

| | Grams |
|---|---|
| Cobalt chloride $CoCl_2 \cdot 6H_2O$ | 30 |
| Sodium hypophosphite $NaH_2PO_2 \cdot H_2O$ | 20 |
| Sodium citrate $Na_3C_6H_5O_7 \cdot 2H_2O$ | 30.4 |
| Ammonium chloride $NH_4Cl$ | 50 |

Deionized water to make 1 liter.
Ammonium hydroxide to raise pH of solution to between about 9 and 10.

Other suitable cobalt-plating baths are described in United States Patent No. 2,532,284 of A. Brenner and G. E. Riddell. Where the above-described cobalt plating bath is employed, the bath preferably is maintained at a temperature between about 90° C. and 95° C. during plating, and the substrates undergoing plating are immersed therein for about 40 minutes.

The aforedescribed specific conditioning bath consisting essentially of water, nickel acetate and acetic acid is only one of many conditioning baths according to the invention. Several other suitable baths are described in the following examples. Moreover the concentrations of the constituents of the aforedescribed bath are by no means limited to those set forth above. For example the following nickel ion-acetate ion solutions may be employed in practicing the process of the invention:

(*a*) A solution consisting essentially of nickel acetate and deionized water, the concentration of the nickel acetate being sufficient to saturate the solution at a temperature of about 90° C.

(*b*) a solution consisting essentially of nickel acetate and glacial acetic acid, the concentration of the nickel acetate being sufficient to saturate the solution at a temperature of about 90° C.

(*c*) a solution prepared by saturating a quantity of deionized water with nickel acetate at about 90° C., cooling the solution to about 22° C., adding a sufficient quantity of 5 normal aqueous sodium hydroxide to raise the pH of the solution to about 6.5 and then reheating the solution to about 90° C. The latter solution is not preferred because the nickel acetate tends to hydrolyze and deposit gelatinous nickel hydroxide on the components undergoing treatment. This gelatinous deposit must be removed prior to application of an electroless plating solution to the pins and plugs. Such gelatinous deposits do not occur in conditioning baths of lower pH.

(*d*) a solution consisting essentially of about 0.5 gram of nickel acetate per liter of glacial acetic acid.

In practicing the process of the invention with any of the foregoing baths, the preferred time of immersion of the diodes is about 10 minutes, the preferred bath temperature, 90° C. to 95° C. However these conditions also may be varied. Thus where a longer treatment time is available, the temperature of the conditioning bath may be lowered.

*Example 2*

Another conditioning bath suitable for practicing the process of the invention has the following composition:

| | |
|---|---|
| Sodium acetate $CH_3COONa \cdot 3H_2O$ | 10 grams. |
| Nickel chloride $NiCl_2 \cdot 6H_2O$ | 13.3 grams. |
| Ammonium chloride $NH_4Cl$ | 33 grams. |
| Hydrochloric acid (concentrated, about 35 percent HCl by weight). A quantity sufficient to reduce the pH of the solution to about 3.0. | |
| Deionized water to make one liter. | |

The sodium acetate, ammonium chloride and nickel chloride are dissolved in the water. Then the hydrochloric acid is added until the pH of the solution has fallen to about 3.0. The solution is heated to and maintained at a temperature between about 90° C. and about 95° C. Diodes cleansed as in Example 1 are immersed in the heated solution for about 10 minutes. Thereafter they are removed from the solution and rinsed in warm deionized water. As a result of the foregoing immersion, the lead-tin solder surfaces are conditioned to be platable with electroless nickel by application thereto of a conventional electroless nickel plating solution, e.g. that set forth in Example 1. It is believed that both the acetate and chloride ions in this solution act as complexing agents for the lead and tin.

*Example 3*

This method is the same as that of Example 2 except that the sodium acetate is omitted from the conditioning bath. It is believed that the chloride ions act as complexing agent in this bath.

*Example 4*

Another conditioning solution usable in practicing the invention consists essentially of:

| | |
|---|---|
| Nickel Chloride $NiCl_2 \cdot 6H_2O$ | 13.3 grams. |
| Ammonium chloride $NH_4Cl$ | 33 grams. |
| Ammonium acetate $CH_3COONH_4$ | 10 grams. |
| Acetic acid $CH_3COOH$ | Sufficient to adjust pH of solution to about 3.4. |
| Deionized water to make 1 liter. | |

The processing conditions described in Example 1 may be employed with this bath. The chloride and acetate ions act as complexing agents.

*Example 5*

Another suitable conditioning bath is prepared as follows: About 55 grams of a solution consisting essentially of about 70 parts by weight of glycolic acid ($HOCH_2COOH$) and about 30 parts by weight of deionized water are dissolved in about 500 milliliters of deionized water. Sufficient 5-normal aqueous sodium hydroxide is added to the glycolic acid solution to raise its pH to about 5.5. Next about 13.3 grams of nickel chloride ($NiCl_2 \cdot 6H_2O$) are added to the solution. The solution then is diluted with deionized water to about one liter and its pH is lowered to about 3.4 by addition thereto of glacial acetic acid. By following the steps of the invention set forth in Example 1, the solution may be used to condition lead-tin substrates to be platable with nickel by application thereto of an electroless nickel plating solution. The acetate ions of the conditioning solution are believed to complex lead and tin ions in preference to nickel ions. The glycolate ions are believed to serve as a buffer.

The foregoing examples set forth relatively simple solutions for conditioning substrates containing lead or tin or both metals to be platable with electroless nickel by application thereto of a conventional plating bath. However, more complicated baths may also be used for this purpose. For example baths containing hypophosphite ions as well as nickel ions and ions which selectively complex lead and tin ions have been found particularly suitable for conditioning lead and tin substrates to be platable electrolessly with nickel. It is believed that the hypophosphite ions coact with the nickel ions in the conditioning bath to deposit nickel electrolessly onto the nickel layer already deposited by displacement onto the lead-tin substrate. Several such hypophosphite-ion-containing baths are set forth in the following examples.

*Example 6*

A hypophosphite-ion-containing bath suitable for use in practicing the invention is prepared by dissolving about 33 grams of ammonium chloride ($NH_4Cl$), about 13.3 grams of nickel chloride ($NiCl_2 \cdot 6H_2O$) and about 16 grams of sodium hypophosphite ($NaH_2PO_2 \cdot H_2O$) in about one liter of deionized water and reducing the pH of this mixture to about 3.5 by stirring concentrated hydrochloric acid thereinto. Then the bath is heated to a temperature between about 90° C. and about 95° C. While the bath is maintained at this temperature, the diodes are immersed therein for about 10 minutes. Thereafter they are rinsed in warm deionized water and immersed in an electroless nickel plating bath, e.g. the bath described in Example 1. During this immersion a bright, tenacious deposit of electroless nickel forms on the lead-tin solder plugs as well as on the terminal pins.

*Example 7*

Conventional electroless nickel plating baths containing nickel cations, hypophosphite anions and ions which complex lead and tin ions in preference to nickel ions can be transformed readily into conditioning baths by appropriate adjustment of their pH. However baths containing agents which strongly complex nickel ions as well as lead and tin ions are unsuitable for such modification. Among the latter baths are those containing tartrate ions or ethylene diamine tetra-acetate ions.

A conventional electroless nickel plating bath which is readily converted into a conditioning bath for practicing the invention is that whose preparation is described in Example 1. Typically this conventional bath contains:

| | | |
|---|---|---|
| Nickel chloride $NiCl_2 \cdot 6H_2O$ | Grams | 40 |
| Ammonium chloride $NH_4Cl$ | do | 100 |
| Sodium hypophosphite $NaH_2PO_2 \cdot H_2O$ | do | 48 |
| Sodium acetate $CH_3COONa \cdot 3H_2O$ | do | 30 |
| Glacial acetic acid $CH_3COOH$ | milliliters | 1.8 |
| Deionized water to make 3 liters. | | |

This bath is transformed into a conditioning bath usable in the process of the invention by adding concentrated hydrochloric acid thereto until its pH is within the range of about 4.5 to about 0.35. Preferably its pH is about 3.9.

Alternatively the pH of the conventional bath may be lowered to the appropriate value by adding both hydrochloric acid and a salt which upon hydrolysis produces acid. For example this result may be achieved by first adding to the conventional solution about 12 milliliters of concentrated hydrochloric acid and then adding thereto about 48 grams of ferrous chloride )$FeCl_2 \cdot 4H_2O$).

To carry out the proces of the invention, either of the latter solutions is established at a temperature between about 90° C. and 95° C. The cleansed diodes are immersed therein for about 10 minutes and are then rinsed in warm deionized water. Their lead-tin solder plugs as well as their pins now may be plated with electroless nickel in conventional manner.

*Example 8*

Another conventional electroless nickel plating bath which can be converted into a conditioning bath for practicing the process of the invention is prepared as follows:

About 55 grams of a solution consisting essentially of about 70 parts by weight of glycolic acid ($HOCH_2COOH$) and about 30 parts by weight of deionized water are dissolved in about 500 milliliters of deionized water. The pH of the resultant solution is increased to about 5.5 by adding 5 normal aqueous sodium hydroxide thereto. About 30 grams of nickel chloride ($NiCl_2 \cdot 6H_2O$) are added to the latter solution and the solution is diluted with deionized water to about one liter. About 10 grams of sodium hypophosphite ($NaH_2PO_2 \cdot H_2O$) are added to the solution.

To transform this conventional solution into a conditioning solution for use in practicing the invention, sufficient concentrated hydrochloric acid is added to lower its pH to between about 3.0 and about 3.9, preferably about 3.5. Alternatively the requisite pH reduction may be achieved by adding to the conventional solution first about 8 milliliters of hydrochloric acid and then about 32 grams of ferrous chloride ($FeCl_2 \cdot 4H_2O$).

To practice the invention, the resultant solution is heated to and maintained at a temperature between about 90° C. and about 95° C., and the cleansed diodes are immersed therein for about ten minutes. The diodes then are rinsed in warm, deionized water. Their lead-tin plugs now can be plated electrolessly with nickel.

*Example 9*

Another conventional electroless nicket plating bath which can be converted to a conditioning bath for use in practicing the process of the invention is one prepared as follows:

About 70 parts by weight of glycolic acid $$(HOCH_2COOH)$$

are dissolved in about 30 parts by weight of deionized water. About 55 grams of this solution are dissolved in about 500 milliliters of water. The pH of the resultant solution is raised to about 5 by adding an appropriate amount of 5 normal aqueous sodium hydroxide. Then about 28.3 grams of nickel ammonium sulfate $$(NiSO_4(NH_4)_2SO_4 \cdot 6H_2O)$$

about 150 grams of ammonium chloride ($NH_4Cl$) and about 16.6 grams of sodium hypophosphite $$(NaH_2PO_2 \cdot H_2O)$$

are dissolved in succession into the glycolate solution. The solution then is diluted with deionized water to about one liter.

To transform this conventional electroless nickel plating solution into a conditioning solution usable in practicing the invention, concentrated hydrochloric acid (35 percent HCl by weight) is added to the conventional solution in a quantity sufficient to reduce the pH thereof to below about 4.0. Alternatively the pH may be reduced by employing a combination of acid and acid-forming salt. For example about 8 milliliters of concentrated hydrochloric acid and about 32 grams of ferrous chloride ($FeCl_2 \cdot 4H_2O$) are dissolved in succession into the conventional bath to form the conditioning bath.

This bath may now be employed in practicing the process according to the invention, e.g. as set forth in Example 1. In practicing this form of the process, chloride ions are believed to complex selectively lead and tin ions derived from the substrate treated. This complexing is believed to raise the effective electrochemical potential of the lead-tin substrate surface above that of the nickel ions and thereby permit displacement plating of nickel. Then the hypophosphite ions are believed to coact with the nickel ions to plate nickel electrolessly onto the thin nickel layer plated by displacement of lead and tin.

Each of Examples 2 to 9 has described a process in which nickel is the metal electrolessly plated onto the conditioned surface comprising lead or tin or both. However metals other than nickel, e.g. cobalt or gold, may be plated electrolessly onto the surfaces processed in the manner set forth in any one of Examples 2 to 9. To plate gold, the process described and claimed in the above-identified Certa application may be employed. To plate cobalt the conventional electroless cobalt-plating process described in Example 1 may be employed.

In addition each specific example has described a conditioning solution comprising nickel ions. However the conditioning solution may comprise ions of either cobalt or iron in place of the nickel ions. Examples of such conditioning solutions are now set forth.

*Example 10*

A conditioning bath containing cobalt ions which is suitable for practicing the process of the invention has the following composition:

Cobalt chloride $CoCl_2 \cdot 6H_2O$, 20 grams.

A solution consisting essentially of about one part by volume of glacial acetic acid and about one part by volume of deionized water to make one liter.

The solution is prepared by dissolving the cobalt chloride in about 500 milliliters of the aqueous acetic acid solution and then diluting the resulting solution to about one liter with additional aqueous acetic acid solution.

To practice the process of the invention, the conditioning bath is heated to a temperature between about 90° C. and about 95° C. and maintained at this temperature during conditioning of the substrate. The cleansed substrate, which may be composed solely of lead or solely of tin or which may comprise alloys or mixtures of both metals, is immersed in the conditioning bath for about ten minutes. In those cases where the substrate is composed solely of lead or solely of tin, it preferably is cleansed before immersion in the conditioning bath by immersion in concentrated fluoboric acid ($HBF_4$) and subsequent rinsing in warm deionized water. After immersion in the conditioning bath, the substrate is readily platable with nickel, cobalt or gold by application thereto of an electroless plating bath containing the appropriate metal. Suitable electroless baths for plating each of these metals already have been described.

The concentrations of the constituents of the cobalt-ion-containing bath are not limited to those set forth above. For example, another cobalt-ion-containing bath which is suitable for practicing the process of the invention consists essentially of glacial acetic acid saturated at about 95° C. with cobalt chloride.

*Example 11*

A conditioning bath containing iron ions which is suitable for practicing the process of the invention has the following composition:

Ferrous chloride $FeCl_2 \cdot 4H_2O$—16 grams.
Sodium acetate $CH_3COONa \cdot 3H_2O$—10 grams.
A solution consisting essentially of about one part by volume of glacial acetic acid and one part by volume of deionized water to make one liter.

In preparing this bath, the ferrous chloride is dissolved in about 500 milliliters of the aqueous acetic acid solution. Then the sodium acetate is dissolved in the solution and the resultant solution is diluted with additional aqueous acetic acid solution to about one liter.

To practice the process of the invention, this bath is heated to and maintained at a temperature between about 90° C. and about 95° C. The cleansed substrate, which may consist solely of lead or solely of tin or comprise both metals, is immersed in the heated bath for about ten minutes. Thereafter it is rinsed well with warm deionized water. The substrate then may be plated electrolessly by application thereto of an electroless plating bath containing ions of the metal to be plated. For example it may be plated with nickel by applying thereto the electroless nickel plating bath described in Example 1.

In many of the foregoing specific examples, the substrate to be processed in accordance with the invention has been described as composed of 60 percent by weight of lead and 40 percent by weight of tin. However in every instance substrates consisting solely of tin or solely of lead or mixtures of lead and tin in any other proportions also may be conditioned by the process of the invention to be platable by application thereto of a conventional electroless plating solution. Indeed the conditioning solutions described in Examples 7 to 9 can also condition substrates containing bismuth or cadmium or both metals to be electrolessly platable. Heretofore bismuth and cadmium as well as lead and tin were considered not to be electrolessly platable.

All of the specific examples have discussed the processing of diodes. However other kinds of articles obviously can be processed according to the invention. For example the process is particularly useful in conditioning the surfaces of waveguides and other ultra-high frequency "plumbing" to be platable with electroless nickel. Such structures, typically made of copper, often have electrical connections secured thereto by lead-tin solder. Heretofore these soldered connections were not platable electrolessly. By processing the waveguide in accordance with the invention, both the copper waveguide and the lead-tin solder connections thereto can readily be plated electrolessly.

The temperature of the conditioning bath has been stated to be preferably between about 90° C. and about 95° C. in order that conditioning shall occur rapidly, e.g. in about 10 minutes. However lower temperatures may be employed where longer conditioning times are available.

In the preceding examples a specific conventional electroless nickel plating bath described in Example 1 is stated to be suitable for plating electroless nickel onto a lead-tin substrate processed according to the invention. However other electroless nickel plating baths may be used in place of the bath described in Example 1, e.g. those described in Examples 8 and 9.

While we have described our invention by means of specific examples and in specific embodiments, we do not wish to be limited thereto, for obvious modifications will occur to those skilled in the art without departing from the scope of our invention.

What we claim is:

1. In a process for conditioning a substrate comprising at least one metal selected from the class consisting of lead and tin to be platable with another metal by application thereto of an electroless plating bath of the type comprising ions of said other metal and hypophosphite anions, the step of applying to said substrate a solution comprising ions of an element selected from the group consisting of nickel, cobalt and iron and an agent consisting of at least one substance selected from the group consisting of acetate ions and chloride ions for selectively complexing ions of metal of said class present in said substrate, the concentration of said agent being such that the last-named metal in said substrate when contacted by said solution exhibits a higher electrochemical potential than said ions of said element in said solution.

2. A process according to claim 1, wherein said element is cobalt.

3. A process according to claim 1, wherein said element is iron.

4. A process according to claim 1, wherein said element is nickel.

5. A process according to claim 4, wherein said complexing agent comprises acetate ions.

6. A process according to claim 4, wherein said complexing agent comprises chloride ions.

7. A process according to claim 4, wherein said complexing agent consists essentially of chloride ions and acetate ions.

8. A process according to claim 4, wherein said solution additionally comprises hypophosphite ions.

9. A process according to claim 4, wherein said solution additionally comprises hypophosphite ions and wherein said complexing agent comprises acetate ions.

10. A process according to claim 4, wherein said solution additionally comprises hypophosphite ions and wherein said complexing agent comprises chloride ions.

11. A process according to claim 4, wherein said solution consists essentially of nickel acetate, acetic acid and water.

12. In a process for conditioning a substrate comprising at least one metal selected from the class consisting of lead and tin to be platable with another metal by application thereto of an electroless plating bath of the type comprising ions of said other metal and hypophosphite ions, the step of applying to said substrate a solution consisting essentially of nickel acetate, acetic acid and water, said nickel acetate having a concentration of between about 0.5 gram per liter of solution and an amount sufficient to saturate said solution.

13. A process according to claim 12, said process comprising the additional step of maintaining said solution at a temperature between about 90° C. and about 97° C. during said application thereof to said substrate.

14. A process according to claim 12, said process comprising the additional step of maintaining said solution at a temperature between about 90° C. and about 97° C. during said application thereof to said substrate, and wherein said application is continued for at least about ten minutes.

15. In a process for conditioning a substrate comprising at least one metal selected from the class consisting of lead and tin to be platable with another metal by application thereto of an electroless plating bath of the type comprising ions of said other metal and hypophosphite anions, the step of applying to said substrate a solution consisting essentially of nickel chloride, ammonium chloride, sodium hypophosphite, sodium acetate, acetic acid, ferrous chloride, hydrochloric acid and water.

16. A process according to claim 15, wherein the constituents of said solution have about the following concentrations per liter of solution

| | | |
|---|---|---|
| Nickel chloride $NiCl_2 \cdot 6H_2O$ | grams | 13 |
| Ammonium chloride $NH_4Cl$ | do | 33 |
| Sodium hypophosphite $NaH_2PO_2 \cdot H_2O$ | do | 16 |
| Sodium acetate $CH_3COONa \cdot 3H_2O$ | do | 10 |
| Glacial acetic acid $CH_3COOH$ | milliliter | 0.6 |
| Concentrated hydrochloric acid | do | 4 |
| Ferrous chloride $FeCl_2 \cdot 4H_2O$ | grams | 16 |

17. A process according to claim 16, wherein said solution is applied to said substrate for at least about ten minutes and the temperature of said solution during said application is between about 90° C. and about 95° C.

18. A process for depositing a layer of a metal selected from the class consisting of nickel, cobalt and iron onto a substrate comprising at least one substance selected from the class consisting of lead and tin, said process comprising the steps of applying to said substrate a solution comprising ions of an element selected from the group consisting of nickel, cobalt and iron and an agent consisting of at least one substance selected from the group consisting of acetate ions and chloride ions for selectively complexing ions of substances of said class present in said substrate, the concentration of said agent being such that the last-named substances in said substrate when contacted by said solution exhibit a higher electrochemical potential than said ions of said element in said solution, and thereafter applying to said substrate an electroless plating bath of the type comprising ions of said metal and hypophosphite ions until said metal deposits on said substrate.

19. In a process for conditioning a substrate comprising at least one metal selected from the class consisting of lead and tin to be platable with another metal by application thereto of an electroless plating bath of the type comprising ions of said other metal and hypophosphite anions, the step of applying to said substrate a solution consisting essentially of cobalt chloride, acetic acid and water.

20. A process according to claim 19, wherein said cobalt chloride has a concentration between about 20 grams per liter of said solution and an amount sufficient to saturate said solution.

21. A process according to claim 19, wherein said solution is maintained at a temperature between about 90° C. and about 95° C. during its application to said substrate.

22. In a process for conditioning a substrate comprising at least one metal selected from the class consisting of lead and tin to be platable with another metal by application thereto of an electroless plating bath of the type comprising ions of said other metal and hypophosphite ions, the step of applying to said substrate a solution consisting essentially of ferrous chloride, sodium acetate, acetic acid and water.

23. A process according to claim 22, wherein said solution is maintained at a temperature between about 90° C. and about 95° C. during its application to said substrate.

24. In a process for conditioning a substrate comprising at least one metal selected from the class consisting of bismuth and cadmium to be platable with another metal by application thereto of an electroless plating bath of the type comprising ions of said other metal and hypophosphite anions, the step of applying to said substrate a solution consisting essentially of nickel chloride, ammonium chloride, sodium hypophosphite, sodium acetate, acetic acid, ferrous chloride, hydrochloric acid and water.

25. A process according to claim 24, wherein the constituents of said solution have about the following concentrations per liter of solution:

| | | |
|---|---|---|
| Nickel chloride $NiCl_2 \cdot 6H_2O$ | grams | 13 |
| Ammonium chloride $NH_4Cl$ | do | 33 |
| Sodium hypophosphite $NaH_2PO_2 \cdot H_2O$ | do | 16 |
| Sodium acetate $CH_3COONa \cdot 3H_2O$ | do | 10 |
| Glacial acetic acid $CH_3COOH$ | milliliter | 0.6 |
| Concentrated hydrochloric acid | do | 4 |
| Ferrous chloride $FeCl_2 \cdot 4H_2O$ | grams | 16 |

26. A process according to claim 25, wherein said solution is applied to said substrate for at least about ten minutes and the temperature of said solution during said application is between about 90° C. and about 95° C.

References Cited in the file of this patent

UNITED STATES PATENTS

| | | |
|---|---|---|
| 2,772,183 | Talmey et al. | Nov. 27, 1956 |
| 2,791,516 | Chambers et al. | May 7, 1957 |
| 2,827,398 | Eisenberg | Mar. 18, 1958 |
| 2,955,958 | Brown | Oct. 11, 1960 |